(12) United States Patent
Nyström et al.

(10) Patent No.: US 6,321,193 B1
(45) Date of Patent: Nov. 20, 2001

(54) DISTANCE AND DISTORTION ESTIMATION METHOD AND APPARATUS IN CHANNEL OPTIMIZED VECTOR QUANTIZATION

(75) Inventors: Johan Nyström; Tomas Svensson; Roar Hagen, all of Stockholm; Tor Björn Minde, Gammelstad, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/238,386

(22) Filed: Jan. 27, 1999

(30) Foreign Application Priority Data

Jan. 27, 1998 (SE) .................................................. 9800219

(51) Int. Cl.[7] .................................................. G10L 11/00
(52) U.S. Cl. .......................................... 704/222; 704/730
(58) Field of Search .................................... 704/221, 222, 704/223, 226, 230

(56) References Cited

U.S. PATENT DOCUMENTS 5,091,945 * 2/1992 Kleijn ........................................ 381/36
5,195,137 * 3/1993 Swaminathan ........................... 381/32
5,598,505 * 1/1997 Austin et al. ............................. 704/226

* cited by examiner

Primary Examiner—William Korzuch
Assistant Examiner—Susan McFadden
(74) Attorney, Agent, or Firm—Burns, Doane, Swecker & Mathis, L.L.P.

(57) ABSTRACT

A channel optimized vector quantization apparatus includes a device for weighting a sample vector x by a weighting matrix A and a device for weighting a set of code book vectors $\hat{c}_r$ by a weighting matrix B. Device form a set of distance measures $\{d_w(Ax,B\hat{c}_r)\}$ representing the distance between the weighted sample vector Ax and each weighted code book vector $B\hat{c}_r$. Other device form a set of distortion measures $\{\varepsilon_{\alpha i}(x)\}$ by multiplying each distance measure by a channel transition probability $P_{r|i}$ that an index r has been received at a decoder when an index i has been sent from an encoder and adding together these multiplied distance measures for each possible index r. Finally device determine an index $i_{min}$ corresponding to the smallest distortion measure $\varepsilon_{\alpha i}(x)$ and represents the sample vector by this index $i_{min}$.

27 Claims, 6 Drawing Sheets

DISTANCE AND DISTORTION ESTIMATION METHOD AND APPARATUS IN CHANNEL OPTIMIZED VECTOR QUANTIZATION

This application claims priority under 35 U.S.C. §§119 and/or 365 to application No. 9800219-9 filed in Sweden on Jan. 27, 1998; the entire content of which is hereby incorporated by reference.

The present invention relates to a distance and distortion estimation method and apparatus in channel optimized vector quantization. The invention also relates to an encoding method and apparatus based on these estimates.

BACKGROUND

Vector quantization (VQ) is a data encoding method in which a sample vector consisting of several samples is approximated by the "nearest" vector of a collection of vectors called a code book. Instead of representing the sample vector by its components, it is represented by the code book index of this "nearest" code book vector. This index is transmitted to a decoder, which uses the index to retrieve the corresponding code book vector from a copy of the code book. Vector quantization is used in, for example, speech coding in mobile telephony.

A common distance or distortion measure (see citation, [1]) to determine the "nearest" code book vector is the squared Euclidean distance between sample vector and code book vector.

Another proposed, more complex distance or distortion measure (see citation [2]) is the perceptually weighted squared Euclidean distance, in which errors in low-energy frequency bands are over-weighted while errors in high-energy bands are under-weighted. The effect is that errors in high-energy parts of a signal tend to be allowed (since the high energy will mask them anyway), while errors in low-energy parts tend to be disallowed (since the error energy would otherwise be a significant part of the total signal energy). The weighting may be performed by a weighting filter, the spectral characteristics of which are essentially the inverse of the spectral characteristics of the signal to be encoded. Since the signal characteristics may be time-varying, the weighting filter may also be time-varying (see citation [2]).

A drawback of these methods is that the transmitted index may, due to the influence of the transmission channel, not always be the same as the received index. In these cases, the actually decoded vector may differ significantly from the original sample vector. The weighted squared Euclidean distance has the further drawback that the weighting filter is sometimes determined in a feedback loop, which implies that a received error may influence the weighting filter and therefore the decoded signal for a long time.

An often used approach to reduce the sensitivity to channel errors is to apply forward error correction coding (FEC). In this way the decoder may detect and even correct errors that occurred during transmission before code book lookup. However, a drawback of this method is that redundancy has to be introduced in the code words that are transmitted over the channel. Furthermore, this method requires very long codes in order to give an acceptable error rate performance. A common way to obtain such long code words is to collect indices from several vector quantized sample vectors before the FEC coding is performed. This collecting process results in a substantial delay, which is in general undesirable in real time applications, such as mobile telephony, video and audio transmission.

An alternative approach to error protection is channel optimized vector quantization (COVQ) (see citation. [3]). Instead of protecting the transmitted index against channel errors, COVQ takes into account the statistical properties of the channel already in the code book construction. The idea behind COVQ is that although the wrong code book index may have been received, the decoded code book vector should still be "close" to the original sample vector. A characteristic feature of COVQ is that the number of indices that may be transmitted often is actually smaller than the number of indices that may be received. In this way, the receiver code book may contain vectors "in between" sample vectors corresponding to actually transmitted indices. A channel error may therefore still result in a decoded vector that is "close" to the intended vector. Thus, COVQ offers a jointly optimized vector quantization and channel protection system. Since long code words are not required, the extra delay introduced by FEC coding may be avoided. However, a drawback of COVQ is that it is very computationally intense. Therefore distance and distortion measures have been based on the simple squared Euclidean distance and not on the more complex but preferable perceptually weighted distance measure.

SUMMARY

It is an object of the present invention to provide a distance and distortion estimation method and apparatus in channel optimized vector quantization that provides increased robustness without the delays that are traditionally associated with channel coded vector quantization indices, preferably without significantly increased complexity.

Another object of the invention is a channel optimized vector quantization encoding method and apparatus that uses these new distance and distortion estimates for more robust encoding.

These objects are achieved by methods and apparatus in accordance with the accompanying claims.

Briefly, the present invention achieves the above object by weighting the sample vector and the code book vectors before distance and distortion measures are calculated by using the weighted vectors. In a preferred embodiment, the complexity of the weighting process is significantly reduced by pre-computing and storing essential quantities.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description, the same reference designations are used for elements with the same or similar functions.

Before the invention is described in detail, a short summary of channel protected vector quantization and channel optimized vector quantization will be given with reference to FIGS. 1–3.

Figure 1:
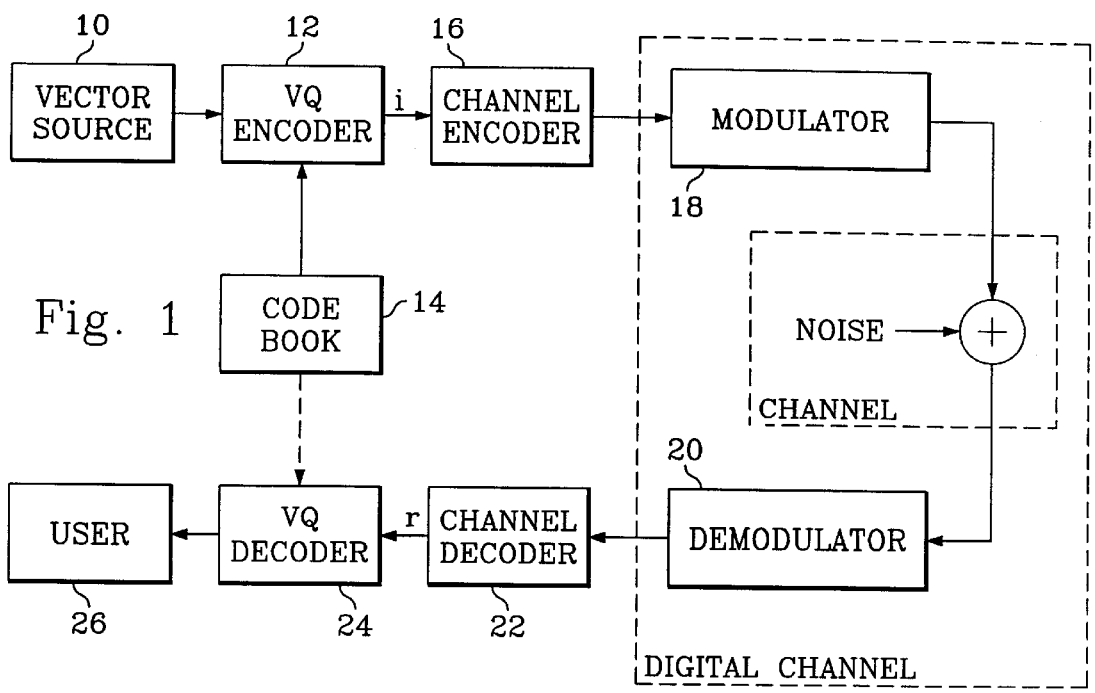
FIG. 1 is a block diagram of a channel protected vector quantization system.

FIG. 1 is a block diagram illustrating the principles of a channel protected vector quantized communication system. A vector source 10 outputs sample vectors to a VQ encoder 12. VQ encoder 12 searches a code book 14 containing a collection of code book vectors to find the "closest" match. The index i of this code book vector is forwarded to a channel encoder 16 that provides this index with error protection. The protected index is forwarded to a modulator 18 and transmitted over a noisy channel. The received signal is demodulated in a demodulator 20. As indicated modulator 18, demodulator 20 and the noisy channel together form a digital channel. The demodulated signal is channel decoded in a channel decoder 22, and a received index r is forwarded to a VQ decoder 24. VQ decoder 24 is a simple lookup table that retrieves a code vector corresponding to index r from a copy of code book 14. The fact that identical code books are used in encoder and decoder has been indicated by the dashed line from code book 14 to decoder 24. Finally the retrieved code book vector is forwarded to a user 26.

Figure 2:
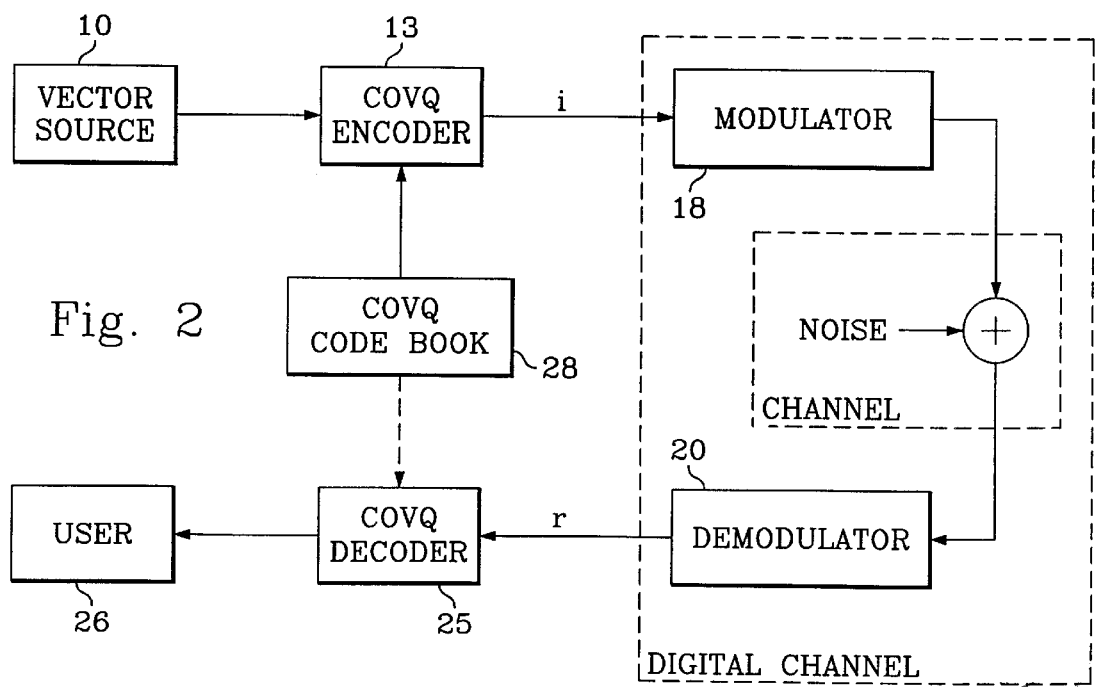
FIG. 2 is a block diagram of a channel optimized vector quantization system.

FIG. 2 is a block diagram illustrating the principles of a channel optimized vector quantized communication system. A vector source 10 outputs sample vectors to a COVQ encoder 13. COVQ encoder 12 uses a COVQ code book 28 containing a large collection of code book vectors to find the "closest" match (in accordance with a distortion measure further described below). An index i characterizing the quantized sample vector is forwarded to a modulator 18 and transmitted over a noisy channel. The received signal is demodulated in a demodulator 20. The received and demodulated index r is forwarded to a COVQ decoder 25. COVQ decoder 25 is a simple lookup table that retrieves a code vector corresponding to index r from a copy of code book 28. Finally the retrieved code book vector is forwarded to a user 26.

As should be apparent from the above, an essential quantity in vector quantization in general is the "closeness" or "distance" $d(x,c_i)$ between a sample vector x and a code book vector $c_i$. A common distance estimate is the squared Euclidean distance measure $$d(x, c_i) = \|x - c_i\|^2$$

In vector quantization (VQ) this measure is usually used to select the code book vector $c_i$ that best matches a given sample vector x.

In channel optimized vector quantization (COVQ) this distance measure may be used to calculate a collection of distortion measures $\alpha_i(x)$ according to $$\alpha_i(x) = E[d(x, \hat{c}_R) | I = i] = \sum_{r=0}^{M-1} d(x, \hat{c}_r) p_{r|i}$$

where E[.] denotes expected value, R,I are stochastic variables, M is the number of vectors in the COVQ code book, $\hat{c}_r$ is a COVQ code book vector corresponding to index r, and $p_{r|i}$ is the conditional channel transition probability that code book index r was received when index i was actually sent over the channel. In other words, $\alpha_i(x)$ represents the expected decoding error or distortion of a sample vector x that has been vector quantized (encoded) to index i. In channel optimized vector quantization the index i giving the smallest distortion $\alpha_i(x)$ for a given sample vector x is selected as the encoding index to be transmitted.

As noted above, the conditional channel transition probabilities $p_{r|i}$ are required to calculate the expected distortions. For a binary symmetric channel the conditional channel transition probabilities $p_{r|i}$ may be calculated as $$p_{r|i} = \epsilon^{d_H(r,i)}(1-\epsilon)^{N-d_H(r,i)}$$

where N denotes the number of bit positions in an index, $d_H(j,i)$ denotes the Hamming distance (the number of differing bits) between j and i, and $\epsilon$ denotes the bit error rate (BER) of the channel.

Figure 3:
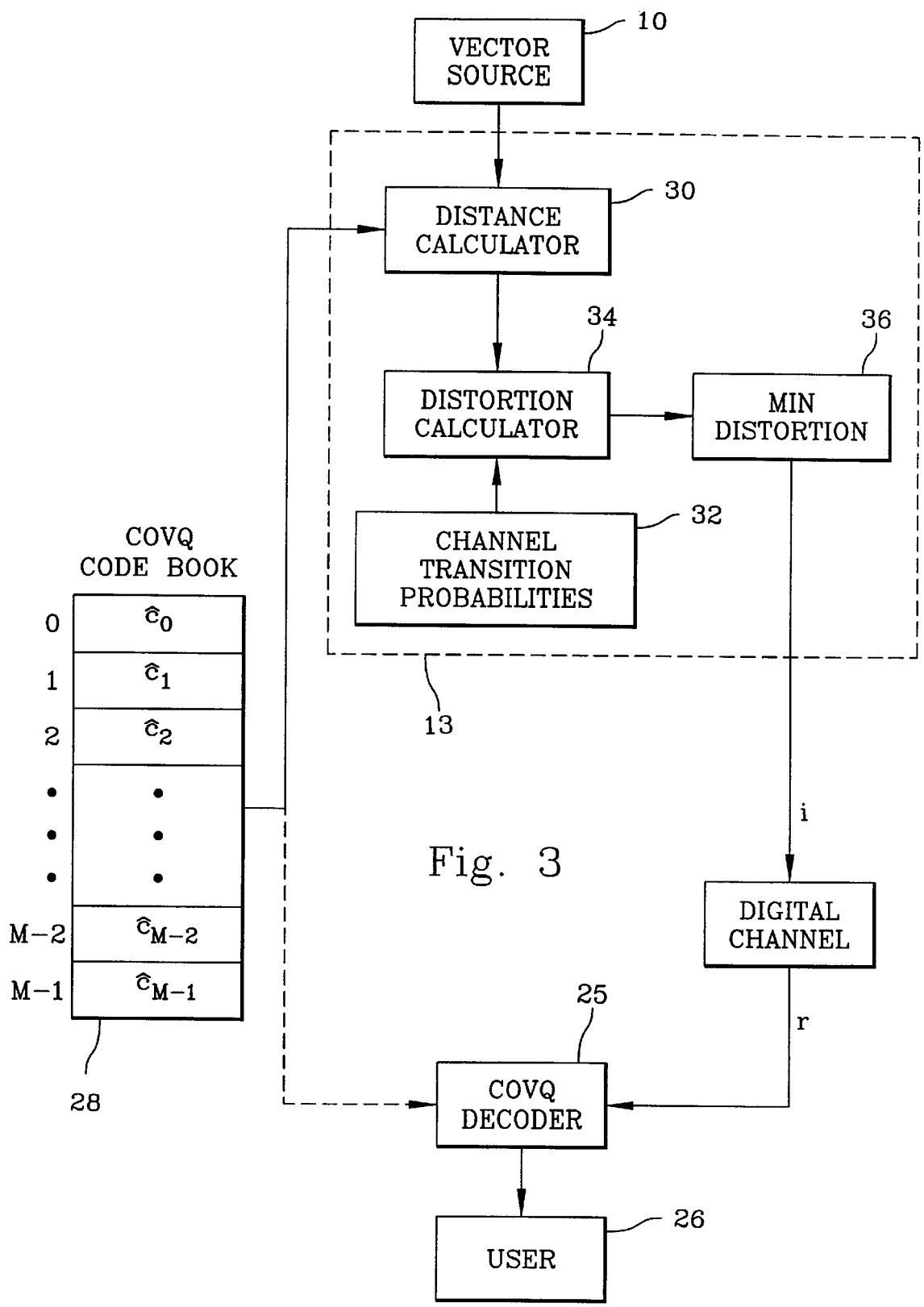
FIG. 3 is a more detailed block diagram of a channel optimized vector quantization system.

FIG. 3 illustrates the "matching" process in the COVQ encoder in more detail. The distances $d(x,\hat{c}_r)$ of a sample vector x from vector source 10 to each of the vectors $\hat{c}_r$ of the code book 28 are calculated in a distance calculator 30. These distances are multiplied by corresponding channel transition probabilities $p_{r|i}$ stored in a storage block 32. The products are formed and accumulated in a distortion calculator 34, which forms a set of distortion measures $\alpha_i(x)$. Block 36 finds the index i of the distortion measure in the set that has the smallest value. This is the index that will be transmitted.

In accordance with an important aspect of the present invention the simple distance measure $d(x,\hat{c}_i)$ above is replaced by a more general class of weighted distance measures $$d_w(x,\hat{c}_i) = d(Ax, B\hat{c}_i)$$

where A is a $d \times l_1$ weighting matrix and B is a $d \times l_2$ weighting matrix such that $$Ax = \begin{pmatrix} A_{11} & A_{12} & \cdots & A_{1l_1} \\ \vdots & & & \vdots \\ A_{d1} & A_{d2} & \cdots & A_{dl_1} \end{pmatrix} \begin{pmatrix} x_1 \\ \vdots \\ x_{l_1} \end{pmatrix} \quad B\hat{c}_i = \begin{pmatrix} B_{11} & B_{12} & \cdots & B_{1l_2} \\ \vdots & & & \vdots \\ B_{d1} & B_{d2} & \cdots & B_{dl_2} \end{pmatrix} \begin{pmatrix} \hat{c}_{i,1} \\ \vdots \\ \hat{c}_{i,l_2} \end{pmatrix}$$

Here $l_1$ is the number of samples in sample vector x, while $l_2$ is the number of components in code book vector $\hat{c}_i$. Thus, this more general weighted distance measure allows for sample vectors and code book vectors having a different number of dimensions. The weighted vectors Ax and $B\hat{c}_i$, however, have the same number of dimensions, namely d. In general the weighting matrices A,B may depend on sample vector x and/or on time. Furthermore, at least one of the matrices A,B should be different from the identity matrix for at least one combination of x, $\hat{c}_i$ (otherwise there would not be any weighting).

In a preferred embodiment of the present invention the distance measure $d_w(x,\hat{c}_i)$ comprises the weighted squared Euclidean distance measure or norm $$d_w(x,\hat{c}_r) = \|Ax - B\hat{c}_r\|^2$$

Other norms are, for example, the Hölder norm $$d_w(x, \hat{c}_r) = \left[\sum_{k=0}^{d-1} |(Ax)_k - (B\hat{c}_r)_k|^v\right]^{\frac{1}{v}}$$

or the Minkowsky norm $$d_w(x, \hat{c}_r) = \max_{0 \le k \le d-1} |(Ax)_k - (B\hat{c}_r)_k|$$

From the above examples it is clear that the weighted distance or error measure according to the present invention does not have to fulfill all the requirements of a mathematical definition of a norm. The preferred weighted distance measure, for example, does not fulfill the triangle inequality.

Furthermore, if certain restrictions are imposed on A or B the following special cases are also obtained.

If A and/or B do not depend on the sample vector x, they do not have to be calculated for each new sample vector, but may be stored.

If either A or B (but not both) equals the identity matrix, the corresponding matrix multiplication may be omitted, giving either $d_w(x,\hat{c}_r)=d(x,B\hat{c}_r)$ or $d_w(x,\hat{c}_r)=d_w(Ax,\hat{c}_r)$.

If A=B one obtains $d_w(x,\hat{c}_r)=d(Ax,A\hat{c}_r)$. For a weighted squared Euclidean distance measure this reduces to $\|A(x-\hat{c}_r)\|^2$ This measure may be useful when vector quantizing line spectral frequencies (LSF).

If A and B are diagonal the complexity of the matrix multiplication is significantly reduced.

The sample vectors and code book vectors may be of the same length d. In this case A,B are square matrices.

Combinations of the above special cases are of course also possible. For example, matrices A and B may be constant, equal and diagonal.

Since the weighting matrices A,B are essential for the present invention, a few examples on the calculation of these matrices will now be given below.

A suitable weighting for vector quantization of LSF parameters is A=B=W, where W is a diagonal matrix. The diagonal elements $w_i$ of W may be calculated according to the equation $w_i=P(\omega_i)^\delta$, where P denotes the power spectrum of the synthesis filter that corresponds to the line spectral frequencies $\omega_i$ and $\delta$ is a constant such that $0<\delta<1$. Since the elements of W depend on the synthesis filter, which is updated on a frame by frame basis, matrix W will be time dependent.

In speech coding it is suitable to employ error weighting through filtering. In this case the weighting matrices A and B are computed from the impulse response $h(0), h(1), \ldots, h(M-1)$ of the filter. Linear filtering with such a filter is equivalent to multiplying with the matrix $$H = \begin{pmatrix} h(0) & 0 & \ldots & 0 \\ h(1) & h(0) & \ldots & 0 \\ \vdots & \vdots & \vdots & \vdots \\ h(M-1) & h(M-2) & \ldots & h(0) \end{pmatrix}$$

The weighting matrices A and B are set equal to H for this type of weighting. In general A and B are built from different impulse responses. For code book search in CELP coding (CELP=Code Excited Linear Predictive). A is given by the impulse response of the perceptual weighting filter, whereas B is given by the impulse response of the cascade of the perceptual weighting filter and the synthesis filter. The weighting matrices A, B will be time dependent (or input data dependent), since the filters are updated for each speech (sub)frame.

In accordance with a further important aspect of the present invention the weighted distance measure may used to calculate a new distortion measure according to $$\alpha_i(x) = E[d(x, \hat{c}_R) | I = i] = \sum_{r=0}^{M-1} d(x, \hat{c}_r) p_{r|i}$$

Figure 4:
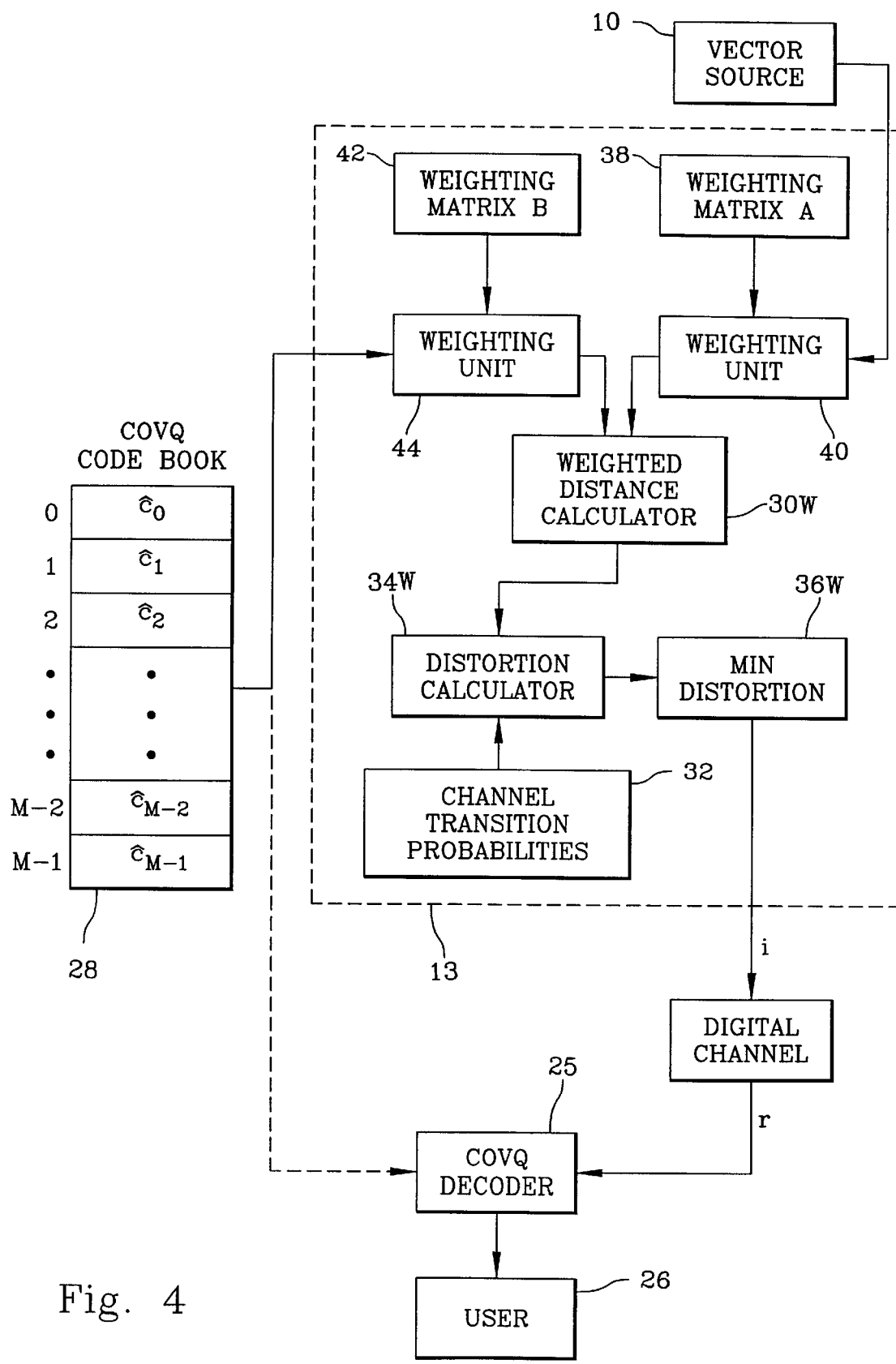
FIG. 4 is a block diagram of an embodiment of a channel optimized vector quantization system in accordance with the present invention.

FIG. 4 is a block diagram of an embodiment of a channel optimized vector quantization system in accordance with the present invention. A weighting matrix A from a matrix storage block 38 is forwarded to a weighting unit 40 together with a sample vector x from vector source 10. Similarly, a weighting matrix B from a matrix storage block 42 is forwarded to a weighting unit 44 together with code book vectors from COVQ code book 28. The weighted vectors from weighting units 40,44 are forwarded to a weighted distance calculator 30W. The weighted distance measures $d_w(x,\hat{c}_r)$ are forwarded to a distortion calculator 34W that calculates a set of (weighted) distortion measures. Block 36W selects the distortion measure in the set that has the smallest value and transmits the corresponding index i over the digital channel. Blocks 30W, 32W, 34W, 36W, 40, 44 are preferably implemented by one or several micro/signal processor combinations.

If weighting matrix B is independent of sample vectors x (and time), a weighted code book may be pre-computed and stored in the encoder. In this case, blocks 42 and 44 may be omitted.

Figure 5:
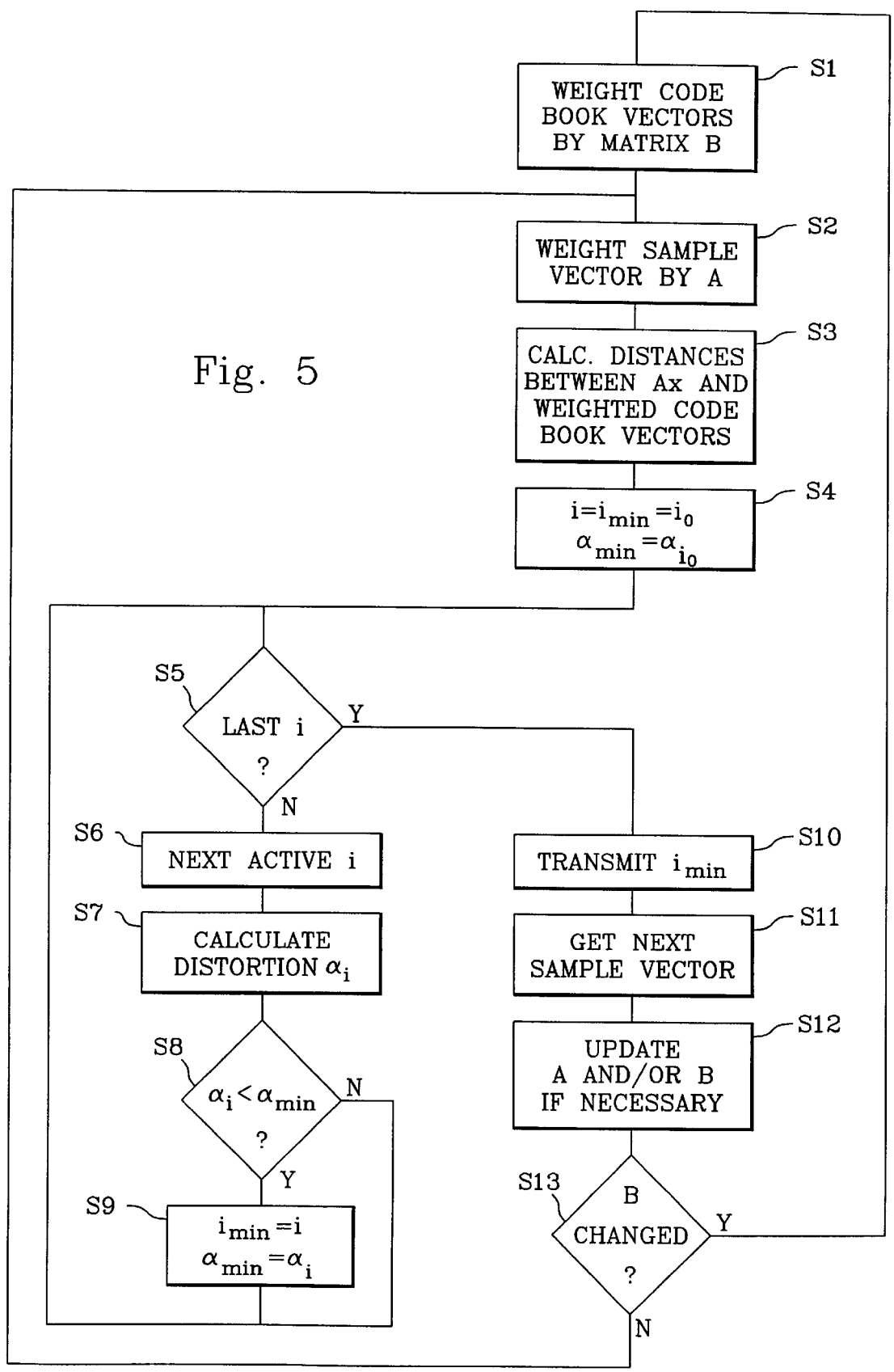
FIG. 5 is a flow chart illustrating the encoding process in a channel optimized vector quantization system in accordance with the present invention.

FIG. 5 is a flow chart illustrating an embodiment of an encoding process in a channel optimized vector quantization system in accordance with the present invention. In step S1 all code book vectors are weighted by weighting matrix B. In step S2 the current sample vector x is weighted by weighting matrix A. In step S3 the distance, for example the squared Euclidean distance, between the weighted sample vector and each weighted code book is calculated. As noted above it is a characteristic feature of COVQ that the number of indices that may be transmitted may actually be smaller than the number of indices that may be received. These indices that may be transmitted are called active indices and are determined during the training of the encoder as explained in [3]. In the search for the best index to transmit, it is therefore only necessary to consider active indices. Step S4 initializes a search loop by setting a search index i and a variable $i_{min}$ to the first active index $i_0$, and by setting a variable $\alpha_{min}$ to the distortion $\alpha$ for this index $i_0$. The loop starts in step S5 by testing whether this is the last active index. If not, step S6 is performed, in which the loop variable is updated to the next active i. Step S7 calculates the corresponding distortion $\alpha_i$. In step S8 the calculated distortion is compared to the current minimum distortion $\alpha_{min}$. If the calculated distortion $\alpha_i$ is less than the current minimum distortion, step S9 updates the variables $i_{min}$ and $\alpha_{min}$. Otherwise step S9 is omitted. The loop then returns to step S5. When all the active indices have been searched, the loop exits to step S10, in which the final value of variable $i_{min}$ is transmitted. Thereafter step S11 gets the next sample vector. If A and/or B depend on x or time they are updated in step S12, if appropriate. Step S13 tests whether weighting matrix B has changed. If so, the process returns to step S1 for weighting the code book vectors by the new weighting matrix B. Otherwise step S1 can be omitted, since the previously calculated weighted code book vectors are still valid, and the process returns to Step S2 instead.

In accordance with a preferred embodiment the weighted squared Euclidean distance measure $d_w(x,\hat{c}_r)=\|Ax-B\hat{c}_r\|^2$ may be used to calculate the distortion measures $\alpha_i(x)$ used in COVQ as $$\alpha_i(x) = E[d_w(x, \hat{c}_R) \mid I = i] = E[\|Ax - B\hat{c}_R\|^2 \mid I = i] =$$

$$\sum_{r=0}^{M-1} \|Ax - B\hat{c}_r\|^2 p_{r|i} = \sum_{r=0}^{M-1} \left(x^T A^T A x - 2x^T A^T B \hat{c}_r + \hat{c}_r^T B^T B \hat{c}_r\right) \cdot p_{r|i} =$$

$$x^T A^T A x \sum_{r=0}^{M-1} p_{r|i} - 2x^T A^T B \sum_{r=0}^{M-1} \hat{c}_r \cdot p_{r|i} + \sum_{r=0}^{M-1} \left(\hat{c}_r^T B^T B \hat{c}_r\right) \cdot p_{r|i} =$$

$$x^T A^T A x - 2x^T A^T B \cdot E[\hat{c}_R \mid I = i] + E[\hat{c}_R^T B^T B \hat{c}_R \mid I = i] =$$

$$x^T A^T A x - 2x^T A^T B \cdot \mu_i + \sigma_i(B)$$

where $\mu_i$ denotes the i:th expected reconstruction vector, which may be pre-computed and stored by using COVQ code book 28 and the channel transition probabilities $p_{r|i}$, and where $\sigma_i(B)$ denotes an i:th code book variance measure, which depends on the choice of B. The first term in this expression is independent of the selected index i, and therefore this term may be omitted, since it only represents a common offset and does not influence the relative magnitudes and ordering of the distortions $\alpha_i$. Thus, it is sufficient to calculate the modified distortion measure $$\alpha_i'(x) = -2x^T A^T B \cdot \mu_i + \sigma_i(B)$$

In this expression the second term $\sigma_i(B)$ is the most computationally intense. However, it involves an expression of the form $c^T B^T B c$, where c is a vector and B is a matrix. Such an expression may be rewritten as $$c^T B^T B c =$$

$$c^T O c = (c_0 \; c_1 \; \ldots \; c_{M-1}) \begin{pmatrix} O_{00} & O_{01} & \ldots & O_{0M-1} \\ O_{10} & & & \\ \vdots & & & \vdots \\ O_{M-10} & & \ldots & O_{M-1M-1} \end{pmatrix} \begin{pmatrix} c_0 \\ c_1 \\ \vdots \\ c_{M-1} \end{pmatrix} =$$

$$(c_0 \; c_1 \; \ldots \; c_{M-1}) \begin{bmatrix} O_{00}c_0 & +O_{01}c_1 & \ldots & +O_{0M-1}c_{M-1} \\ O_{10}c_0 & +O_{11}c_1 & \ldots & +O_{1M-1}c_{M-1} \\ \vdots & \vdots & \vdots & \vdots \\ O_{M-10}c_0 & +O_{M-11}c_1 & \ldots & +O_{M-1M-1}c_{M-1} \end{bmatrix} =$$

$$\begin{array}{cccc} O_{00}c_0 c_0 & +O_{01}c_0 c_1 & \ldots & +O_{0M-1}c_0 c_{M-1} \\ +O_{10}c_1 c_0 & +O_{11}c_1 c_1 & \ldots & +O_{1M-1}c_1 c_{M-1} \\ \vdots & \vdots & \vdots & \vdots \\ +O_{M-10}c_{M-1}c_0 & +O_{M-11}c_{M-1}c_1 & \ldots & +O_{M-1M-1}c_{M-1}c_{M-1} \end{array} =$$

$$\sum_{\substack{All \\ elements}} \left( \begin{pmatrix} c_0 c_0 & c_0 c_1 & \ldots & c_0 c_{M-1} \\ c_1 c_0 & c_1 c_1 & \ldots & c_1 c_{M-1} \\ \vdots & \vdots & \vdots & \vdots \\ c_{M-1}c_0 & c_{M-1}c_1 & \ldots & c_{M-1}c_{M-1} \end{pmatrix} \otimes \right.$$

$$\begin{pmatrix} O_{00} & O_{01} & \ldots & O_{0M-1} \\ O_{10} & & & \\ \vdots & & & \vdots \\ O_{M-10} & & \ldots & O_{M-1M-1} \end{pmatrix} \Bigg) =$$

$$(1 \; 1 \; \ldots \; 1) \left( \left( \begin{pmatrix} c_0 \\ c_1 \\ \vdots \\ c_{M-1} \end{pmatrix} (c_0 \; c_1 \; \ldots \; c_{M-1}) \right) \otimes \right.$$

$$\begin{pmatrix} O_{00} & O_{01} & \ldots & O_{0M-1} \\ O_{10} & & & \\ \vdots & & & \vdots \\ O_{M-10} & & \ldots & O_{M-1M-1} \end{pmatrix} \Bigg) \begin{pmatrix} 1 \\ 1 \\ \vdots \\ 1 \end{pmatrix} =$$

$$1^T((cc^T) \otimes O)1 = 1^T((c^T) \otimes B^T B)1$$

where $\otimes$ denotes elementwise multiplication and 1 represents a vector consisting of all ones. Thus, remembering that B is independent of i one obtains $$\sigma_i(B) = E[\hat{c}_R^T B^T B \hat{c}_R | I=i] = 1^T (E[\hat{c}_R \hat{c}_R^T | I=i] \otimes (B^T B))1 = 1^T (\Phi_i \otimes (B^T B))1$$

where $$\Phi_i = E[\hat{c}_R \hat{c}_R^T \mid I = i] = \sum_{r=0}^{M-1} \hat{c}_r \hat{c}_r^T \cdot p_{r|i}$$

is denoted the i:th conditional code book correlation matrix. Thus, the modified distortion measure $a_i'(x)$ may be written as $$\alpha_i'(x) = -2x^T A^T B \cdot \mu_i + 1^T (\Phi_i \otimes (B^T B))1$$

Since $\mu_i$ and $\Phi_i$ only depend on the COVQ code book and the channel transition probabilities, these quantities may be pre-computed and stored, which significantly reduces the complexity of the calculation of the modified distortion measures. Furthermore, if certain restrictions are imposed on A or B the following special cases may be obtained.

If A and/or B do not depend on the sample vector x (or time) they do not have to be updated for each new sample vector. In the special case where both A and B are constant the vector quantities $-2A^T B \cdot \mu_i$ and the scalar quantities $1^T(\Phi_i \otimes (B^T B))1$ may be pre-computed and stored. If only B is constant the vector quantities $-2B \cdot \mu_i$ and the scalar quantities $1^T(\Phi_i \otimes (B^T B))1$ may be pre-computed and stored.

If either A or B (but not both) equals the identity matrix, the corresponding matrix multiplication may be omitted. If B equals the identity matrix, the second term is reduced to the constant scalar quantities $1^T \Phi_i 1 = \text{diag}(\Phi_i)$, which may be pre-computed and stored.

If A=B the complexity is reduced, since $B^T B$ has to be calculated only for one of the terms in $\alpha_i'(x)$ and may be reused for the other.

If A and/or B are diagonal the complexity of the matrix multiplication is significantly reduced. If A is diagonal the first term in $\alpha_i'(x)$ is simplified, since $x^T A^T$ reduces to an inner product instead of a matrix multiplication. If B is diagonal $B^T B$ will also be diagonal, which means that the second term in $\alpha_i'(x)$ will only require the diagonal elements of $\Phi_i$. This reduces the storage requirements for $\Phi_i$ and also the complexity of the calculation of the second term.

Combinations of the above special cases are of course also possible. For example, matrices A and B may be constant, equal and diagonal.

Figure 6:
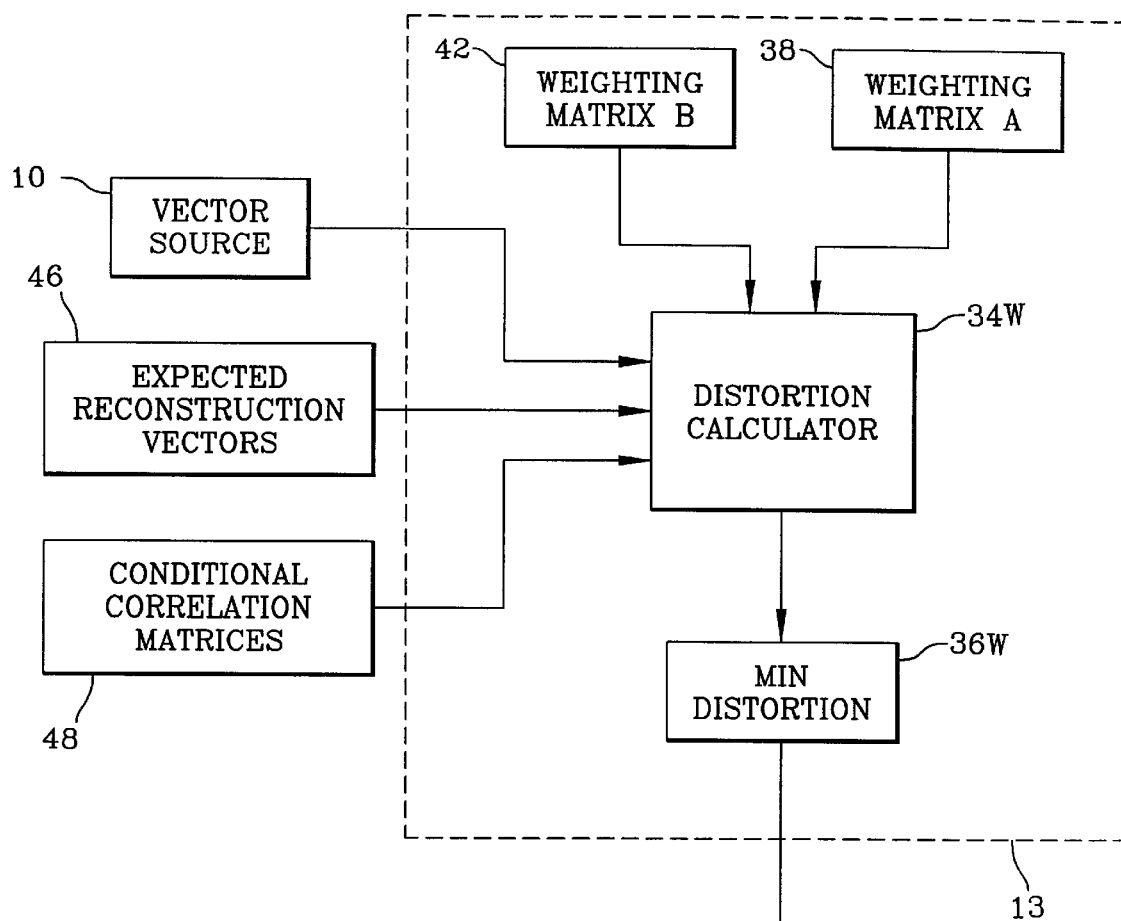
FIG. 6 is a block diagram of a preferred embodiment of a channel optimized vector quantization system in accordance with the present invention.
Figure 6:
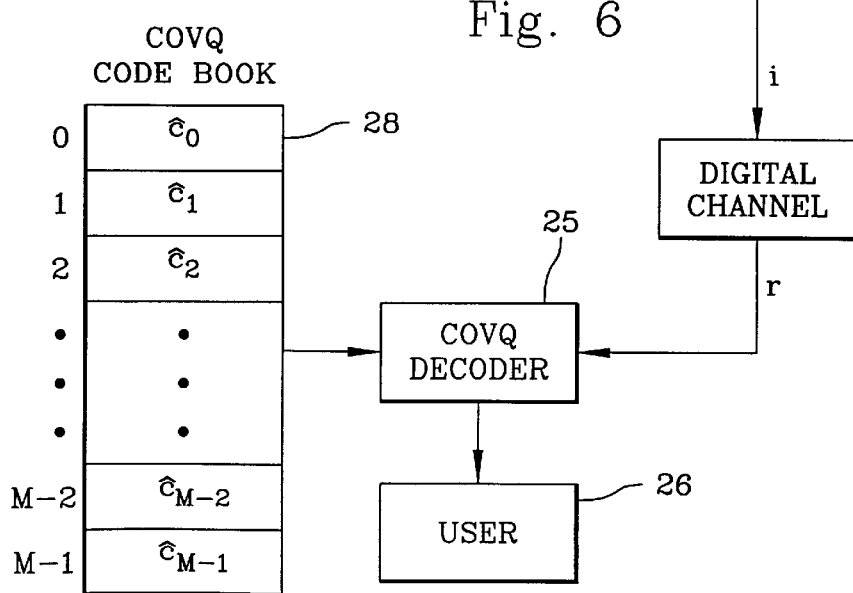

FIG. 6 is a block diagram of a preferred embodiment of a channel optimized vector quantization system in accordance with the present invention. In this embodiment pre-calculated expected reconstruction vectors $\mu_i$ and conditional correlation matrices $\Phi_i$ are stored in storage blocks 46 and 48, respectively. These quantities may be said to replace encoder code book 14 and channel transition probabilities storage block 32 of the embodiment in FIG. 4 (the code vectors and transition probabilities are of course essential for the pre-computation of these quantities, as outlined above). Together with sample vectors from vector source 10 and weighting matrices A and B from blocks 38 and 42, a set of distortions is calculated in distortion calculator 34W. Block 36W selects the distortion measure in the set that has the smallest value and transmits the corresponding index i over the digital channel. It is to be noted that also in this embodiment a decoder code book 28 is still used for lookup on the decoding side. Blocks 34W,36W are preferably implemented by one or several micro/signal processor combinations.

Figure 7:
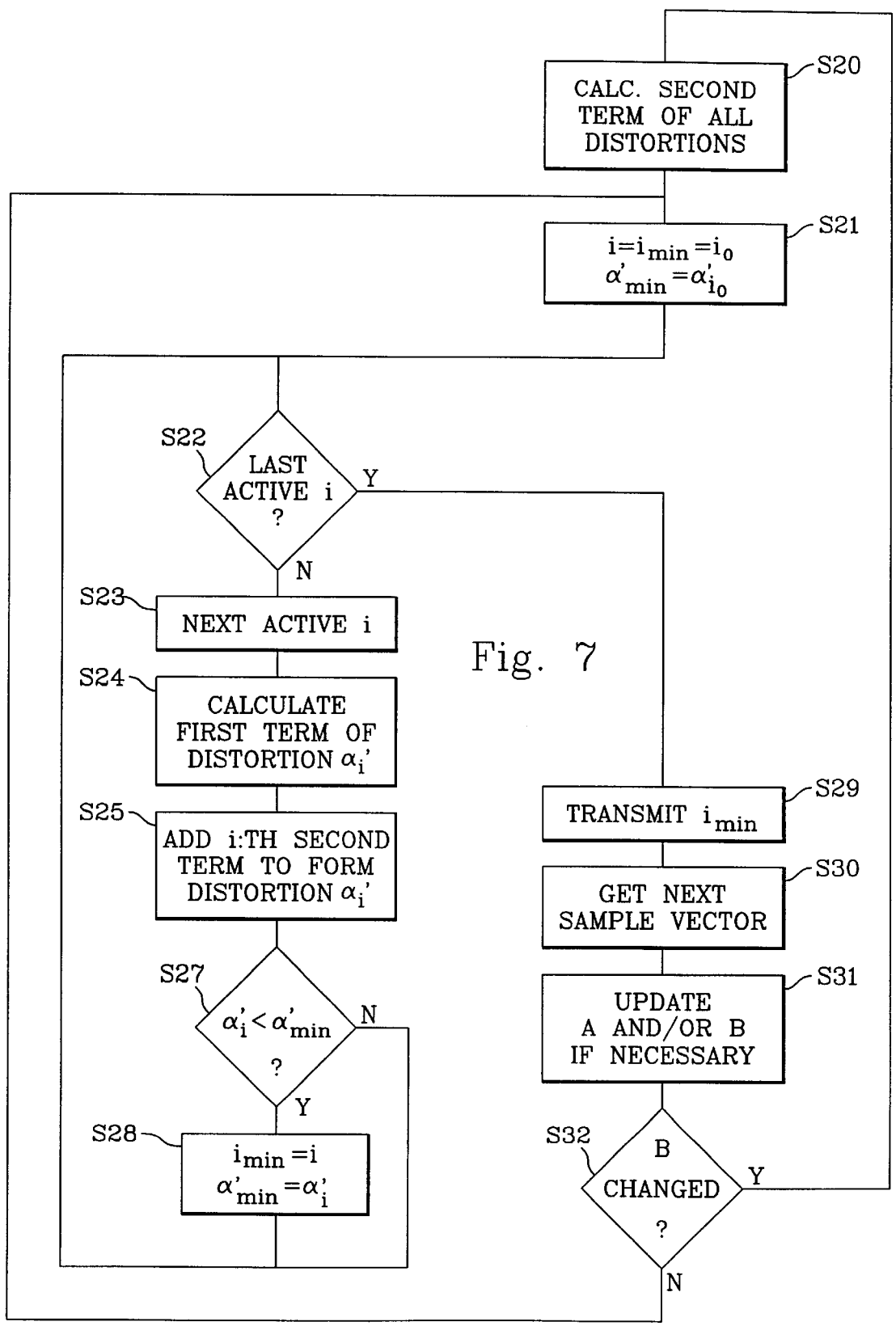
FIG. 7 is a flow chart illustrating the encoding process in a channel optimized vector quantization system in accordance with a preferred embodiment of the present invention.

FIG. 7 is a flow chart illustrating an example of an encoding process in a channel optimized vector quantization system in accordance with a preferred embodiment of the present invention. In step S20 the second term (involving weighting matrix B, but not the sample vector x) of all the distortions $\alpha_i'$ are calculated using the pre-computed quantities $\Phi_i$. Step S21 initializes a search loop by setting a search index i and a variable $i_{min}$ to the first active index $i_0$, and by setting a variable $\alpha'_{min}$ to the modified distortion for this index $i_0$. The loop starts in step S22 by testing whether this is the last active index. If not, step S23 is performed, in which the loop variable is updated to the next active i. In step S24 the first term of the corresponding distortion $\alpha_i'$ Step S25 calculates the distortion $\alpha_i'$ by adding this first and its corresponding second term (calculated in step S20). In step S27 the calculated distortion is compared to the current minimum distortion $\alpha'_{min}$. If the calculated distortion $\alpha_i'$ is less than the current minimum distortion, step S28 updates the variables $i_{min}$ and $\alpha'_{min}$. Otherwise step S28 is omitted. The loop then returns to step S22. When all the active indices have been searched, the loop exits to step S29, in which the final value of variable $i_{min}$ is transmitted. Thereafter step S30 gets the next sample vector. If A and/or B depend on x or time they are updated in step S31, if appropriate. Step S32 tests whether weighting matrix B has changed. If so, the process returns to step S20 for updating the second term of all distortions with the new weighting matrix B. Otherwise step S20 can be omitted, since the previously calculated second terms are still valid, and the process returns to Step S21 instead.

In the above description, a digital channel has been assumed. However, a basic weighted distance measure along the same principles may also be introduced for analog output channels, if the channel transition probabilities are replaced by channel transition density functions and summation is replaced by integration.

The new distance/distortion measures and encoding method in according with the present invention provide channel optimized data dependent quantization and gives robustness at low delays.

The preferred embodiment of the invention achieves this at substantially reduced computational complexity, especially if special structures of the weighting matrices A and B may be exploited.

It will be understood by those skilled in the art that various modifications and changes may be made to the present invention without departure from the spirit and scope thereof, which is defined by the appended claims.

1. Y. Linde, A. Buzo and R. M. Gray, "An algorithm for Vector Quantizer Design", IEEE Trans. Communication, Vol. COM-28, pp 84–95, January 1980.

2. International Telecommunication Union, "Coding of Speech at 16 kbit/s Using Low-Delay Code Excited Linear Prediction", Recommendation G.728, Geneva, 1992.

3. Nariman Farvardin, Vinay Vaishampayan, "On the Performance and Complexity of Channel-Optimized Vector Quantizers", IEEE Transaction on Information Theory, Vol. 37, No. 1, pp 155–60, January 1991.

What is claimed is:

1. A distance estimation method in channel optimized vector quantization, comprising the steps of:

forming a sample vector x by sampling an input signal;

weighting the sample vector x by a first weighting matrix A;

weighting a code book vector $\hat{c}_r$ by a second weighting matrix B different from said first weighting matrix A; and forming a distance measure $d_w(Ax, B\hat{c}_r)$ representing the distance between said weighted sample vector Ax and said weighted code book vector $B\hat{c}_r$.

2. The method of claim 1, wherein said sample vector x and said code book vector $\hat{c}_r$ are of the same length.

3. The method of claim 1, wherein said distance measure $d_w(Ax, B\hat{c}_r)$ is a weighted squared Euclidean distance measure.

4. The method of claim 1, wherein only one of said first weighting matrix A and said second weighting matrix B is different from the identity matrix.

5. The method of claim 1, wherein each weighting matrix A,B is sample vector independent.

6. The method of claim 1, wherein each weighting matrix A,B is time independent.

7. The method of claim 1, wherein each weighting matrix A,B is constant.

8. A distortion estimation method in channel optimized vector quantization, comprising the steps of:

forming a sample vector x by sampling an input signal;

weighting the sample vector x by a first weighting matrix A;

weighting a set of code book vectors $\hat{c}_r$ by a second weighting matrix B different from said first weighting matrix A;

forming a set of distance measures $d_w(Ax, B\hat{c}_r)$ representing the distance between said weighted sample vector Ax and each weighted code book vector $B\hat{c}_r$;

forming a distortion measure $\alpha_i(x)$ by multiplying each distance measure by a predetermined channel transition probability $p_{r|i}$ that an index r has been received at a decoder when an index i has been sent from an encoder and adding together said multiplied distance measures for each possible index r.

9. A channel optimized vector quantization method, comprising the steps of:

forming a sample vector x by sampling an input signal;

weighting the sample vector x by a first weighting matrix A;

weighting a set of code book vectors $\hat{c}_r$ by a second weighting matrix B different from said first weighting matrix A;

forming a set of distance measures $d_w(Ax, B\hat{c}_r)$ representing the distance between said weighted sample vector Ax and each weighted code book vector $B\hat{c}_r$;

forming a set of distortion measures $\{\alpha_i(x)\}$ by multiplying each distance measure by a predetermined channel transition probability $p_{r|i}$ that an index r has been received at a decoder when an index i has been sent from an encoder and adding together said multiplied distance measures for each possible index r;

determining an index $i_{min}$ corresponding to the smallest distortion measure $\alpha_i(x)$; and representing said sample vector by this index $i_{min}$.

10. A channel optimized vector quantization method, comprising the steps of:

forming a sample vector x by sampling an input signal;

calculating a set of distortion measures $\{\alpha_i'(x)\}$ in accordance with the expression $$\alpha_i'(x) = -2x^T A^T B \mu_i + 1^T (\phi_i \otimes (B^T B)) 1$$

where,

A is a sample vector weighting matrix,

B is a code book vector weighting matrix, at least one of said weighting matrices A, B being different from the identity matrix, $\mu_i$ is an expected i:th reconstruction vector, $\phi_i$ is a conditional i:th code book correlation matrix, $T$ denotes transposition, 1 denotes a vector consisting of all ones, and $\otimes$ denotes elementwise multiplication;

determining an index $i_{min}$ corresponding to the smallest distortion measure $\alpha_i'(x)$; and representing said sample vector by this index $i_{min}$.

11. A distortion estimation method in channel optimized vector quantization, comprising the steps of:

forming a sample vector x by sampling an input signal;

calculating a distortion measure $\alpha_i'(x)$ in accordance with the expression $$\alpha_i'(x) = -2x^T A^T B \mu_i + 1^T (\phi_i \otimes (B^T B)) 1$$

where

A is a sample vector weighting matrix,

B is a code book vector weighting matrix, at least one of said weighting matrices A, B being different from the identity matrix, $\mu_i$ is an expected i:th reconstruction vector, $\phi_i$ is a conditional i:th code book correlation matrix, $T$ denotes transposition, 1 denotes a vector consisting of all ones, and $\otimes$ denotes elementwise multiplication.

12. The method of claim 11, wherein said expected i:th reconstruction vector is defined as $$\mu_i = \sum_{r=0}^{M-1} \hat{c}_r \cdot p_{r|i}$$

where $\hat{c}_r$ is the r:th code book vector, and $p_{r|i}$ is a predetermined channel transition probability that an index r has been received at a decoder when an index i has been sent from an encoder.

13. The method of claim 11 wherein said conditional i:th code book correlation matrix is defined as $$\Phi_i = \sum_{r=0}^{M-1} \hat{c}_r \hat{c}_r^T \cdot p_{r|i}$$

where $\hat{c}_r$ is the r:th code book vector, and p1 $p_{r|i}$ is a predetermined channel transition probability that an index r has been received at a decoder when an index i has been sent from an encoder.

14. The method of claim 11, further comprising:

pre-computing and storing the quantities $-2_{\mu i}$ and $\Phi_i$; and retrieving these stored quantities each time a distortion measure $\alpha_i'(x)$ is to be calculated for a given sample vector x.

15. The method of claim 14, wherein only said code book vector weighting matrix B is different from the identity matrix.

16. The method of claim 14, wherein said sample vector weighting matrix A and said code book weighting matrix B are the same matrix.

17. The method of claim 14, wherein said sample vector weighting matrix A is diagonal.

18. The method of claim 14, wherein said code book vector weighting matrix B is diagonal.

19. The method of claim 11, wherein only said sample vector weighting matrix A is different from the identity matrix, said method further comprising:

pre-computing and storing the quantities $-2_{\mu i}$ and $1^T \Phi_i 1$; and retrieving these stored quantities each time a distortion measure $\alpha_i'(x)$ is to be calculated for a given sample vector x.

20. The method of claim 11, wherein said code book vector weighting matrix B constant and different from the identity matrix, said method further comprising:

pre-computing and storing the quantities $-2B_{\mu i}$ and $1^T(\Phi_i \otimes (B^T B)) 1$; and retrieving these stored quantities each time a distortion measure $\alpha_i'(x)$ is to be calculated for a given sample vector x.

21. The method of claim 11, wherein said sample vector weighting matrix A and said code book vector weighting matrix B are both constant and different from the identity matrix, said method further comprising pre-computing and storing the quantities $-2A^T B_{\mu i}$ and $1^T(\Phi_i \otimes (B^T B))1$; and retrieving these stored quantities each time a distortion measure $\alpha_i'(x)$ is to be calculated for a given sample vector x.

22. A distance estimation apparatus in channel optimized vector quantization, comprising:

means for forming a sample vector x by sampling an input signal;

means for weighting the sample vector x by a first weighting matrix A;

means for weighting a code book vector $\hat{c}_i$ by a second weighting matrix B different from said first weighting matrix A; and means for forming a distance measure $d_w$ ($Ax, B\hat{c}^i$) representing the distance between said weighted sample vector Ax and said weighted code book vector $B^{\hat{c}_i}$.

23. A distortion estimation apparatus in channel optimized vector quantization, comprising:

means for forming a sample vector x by sampling an input signal;

means for weighting the sample vector x by a first weighting matrix A;

means for weighting a set of code book vectors $\hat{c}_r$ by a second weighting matrix B different from said first weighting matrix A;

means for forming a set of distance measures $d_w(Ax,B\hat{c}_r)$ representing the distance between said weighted sample vector $Ax$ and each weighted code book vector $B\hat{c}_r$;

means for forming a distortion measure by multiplying each distance measure by a predetermined channel transition probability $p_{r|i}$ that an index r has been received at a decoder when an index i has been sent from an encoder and adding together said multiplied distance measures for each possible index r.

24. A channel optimized vector quantization apparatus, comprising:

means for forming a sample vector x by sampling an input signal;

means for weighting the sample vector x by a first weighting matrix A;

means for weighting a set of code book vectors $\hat{c}_r$ by a second weighting matrix B different from said first weighting matrix A;

means for forming a set of distance measures $\{d_w(Ax, B\hat{c}_r)\}$ representing the distance between said weighted sample vector $Ax$ and each weighted code book vector $B\hat{c}_r$;

means for forming a set of distortion measures $\{\alpha_i(x)\}$ by multiplying each distance measure by a predetermined channel transition probability $P_{r|i}$ that an index r has been received at a decoder when an index i has been sent from an encoder and adding together said multiplied distance measures for each possible index r;

means for determining an index $i_{min}$ corresponding to the smallest distortion measure $\alpha_i(x)$ and representing said sample vector by this index $i_{min}$.

25. A distortion estimation apparatus in channel optimized vector quantization, comprising:

means for forming a sample vector x by sampling an input signal; and means for calculating a distortion measure $\alpha_i'(x)$ in accordance with the expression $$\alpha_i'(x) = -2x^T A^T B \cdot \mu_i + 1^T (\phi_i \otimes (B^T B)) 1$$

where

A is a sample vector weighting matrix,

B is a code book vector weighting matrix, at least one of said weighting matrices A, B being different from the identity matrix, $\mu_i$ is an expected i:th reconstruction vector, $\phi_i$ is a conditional i:th code book correlation matrix, $T$ denotes transposition, 1 denotes a vector consisting of all ones, and $\otimes$ denotes elementwise multiplication.

26. A channel optimized vector quantization apparatus, comprising:

means for forming a sample vector x by sampling an input signal;

means for calculating a set of distortion measures $\{\alpha_i'(x)\}$ in accordance with the expression $$\alpha_i'(x) = -2x^T A^T B \cdot \mu_i + 1^T (\phi_i \otimes (B^T B)) 1$$

where

A is a sample vector weighting matrix,

B is a code book vector weighting matrix, at least one of said weighting matrices A, B being different from the identity matrix, $\mu_i$ is an expected i:th reconstruction vector, $\phi_i$ is a conditional i:th code book correlation matrix, $T$ denotes transposition, 1 denotes a vector consisting of all ones, and $\otimes$ denotes elementwise multiplication; and means for determining an index $i_{min}$ corresponding to the smallest distortion measure $\alpha_i'(x)$ and representing said sample vector by this index $i_{min}$.

27. The apparatus of claim 26, comprising:

means for storing the pre-computed quantities $-2_{\mu i}$ and $\Phi_i$ and for retrieving these stored quantities each time a distortion measure $\alpha_i'(x)$ is to be calculated for a given sample vector x.

* * * * *